United States Patent
Leifso et al.

(10) Patent No.: US 6,211,753 B1
(45) Date of Patent: Apr. 3, 2001

(54) ACTIVE TUNABLE INDUCTOR

(76) Inventors: Curtis Leifso, 3715 - 28th Avenue S.W., Calgary, Alberta (CA), T3E 0S2; James W. Haslett, Box 5, Site 37, RR 12, Calgary, Alberta (CA), T3E 6W3

(*) Notice: Subject to any disclaimer, the term of this patent is extended or adjusted under 35 U.S.C. 154(b) by 0 days.

(21) Appl. No.: 09/276,403

(22) Filed: Mar. 25, 1999

(30) Foreign Application Priority Data

Mar. 12, 1999 (CA) .................................................. 2265425

(51) Int. Cl.$^7$ .................................................. H03H 11/00
(52) U.S. Cl. .................................................. 333/214; 327/110
(58) Field of Search .................................................. 333/213, 214, 333/215, 216, 217; 327/110, 105, 478

(56) References Cited

U.S. PATENT DOCUMENTS

| | | | |
|---|---|---|---|
| 3,693,105 | 9/1972 | Kleinberg ................................ | 330/12 |
| 4,873,497 | 10/1989 | Kielmeyer, Jr. .................. | 331/108 B |
| 5,175,513 | 12/1992 | Hara ...................................... | 331/115 |
| 5,202,655 | 4/1993 | Hara ...................................... | 333/215 |
| 5,256,991 | 10/1993 | Campbell et al. ................... | 333/215 |
| 5,347,238 | 9/1994 | Kobayashi ........................ | 331/117 R |
| 5,726,613 | 3/1998 | Hayashi et al. ...................... | 333/214 |
| 6,028,496 | * 2/2000 | Ko et al. .............................. | 333/214 |

OTHER PUBLICATIONS

GaAs MESFET Active Resonant Circuit for Microwave Filter Applications, D.G. Haigh, IEEE: Transactions on Microwave Theory and Techniques, vol. 42, No. 7, Jul. 1994, P. 1419–1422.

Broad–Band Monolithic Microwave Active Inductor and Its application to Miniaturized Wide–Band Amplifiers, Shinji Hara, Tsuneo Tokumitsu, Toshiaki Tanaka, Masayoshi Aikawa, IEEE Transactions on Microwave Theory and Techniques, vol. 36, No. 12, Dec. 1988, p. 1920–1924.

Lossless Broad–Band Monolithic Microwave Active Inductors, Shinji Hara, Tsuneo Tokumitsu, Masayoshi Aikawa, IEEE Transactions on Microwave Theory and Techniques, vol. 37, No. 12, Dec. 1989, p. 1979–1984.

Monolithic Narrow–Band Filter Using Ultrahigh–Q Tunable Active Inductors, Stepan Lucyszyn, Ian D. Robertson, IEEE Transactions on Microwave Theory and Techniques, vol. 42, No. 12, Dec. 1994, p. 2617–2622.

Q–Enhancing Technique for High Speed Active Inductors, Risto Kaunisto, Petteri Alinikula, Kari Stadius, 1994 ISCA's, p. 735–738.

A Novel Active Inductor and Its Application to Inductance–Controlled Oscillator, Yong–Ho Cho, Song–Cheol Hong, Young–Se Kwon, IEEE Transactions on Microwave Theory and Techniques, vol. 45, No. 8, Aug. 1997, p. 1208–1213.

* cited by examiner

Primary Examiner—Robert Pascal
Assistant Examiner—Kimberly Glenn
(74) Attorney, Agent, or Firm—Ormiston Korfanta & Holland

(57) ABSTRACT

A 1.1 GHz fully integrated GaAs MESFET active inductor is presented. Both the inductance and loss resistance are tunable with the inductance independent of series loss tuning. The measured loss resistance is tunable over a −10 Ω to +15 Ω range with a corresponding change in inductance of less than 10% at 100 MHz and less than 4% for frequencies above 500 MHz for capacitive tuning. The inductance is tunable from 65 nH to 90 nH. The measured loss resistance is shown to be dc bias voltage tunable over a 0 to +10 Ω range with an inductance tunable from 55 nH to 110 nH, with negligible interaction between loss resistance and inductance for frequencies from 100 MHz to 1.1 GHz. Several embodiments a using MESFETs and MOSFETs are described. A negative impedance converter is included to achieve increased bandwidth in all circuit realizations. Considerably larger bandwidths can be achieved depending on the fabrication technology employed and the intended application of the circuit.

10 Claims, 22 Drawing Sheets

ACTIVE TUNABLE INDUCTOR

FIELD OF THE INVENTION

This invention relates to tunable active inductors, particularly active inductors made using a monolithic radio frequency integrated circuit (RFIC).

BACKGROUND OF THE INVENTION

A significant restraint in RF and microwave IC design stems from the difficulty in realizing an integrated passive inductor with sufficiently high Q over a broad bandwidth. Large space requirements, low inductance values and low Q factors make these inductors unsuitable for precision applications.

Active designs have allowed larger inductance values to be realized. However, the active inductors published to date are limited in that they are often not tunable. When inductance tuning is introduced, the Q factor usually shows a strong dependence on both the tuning parameter and the frequency of operation. As a result, tuning both the inductance and the Q factor requires an iterative tuning procedure.

A Q-enhancing technique has been described by Tokumitsu et al in [1]. In this design a cascode FET arrangement with resistive feedback is used such that when the FETs are matched, the active inductor's loss resistance can be canceled. The resistive feedback described in [1] was replaced with a common gate FET in [2] which offered improved Q factor. everHow, tuning of Q of the inductance was not easily accomplished.

Alinikula et al [3] described an alternative topology to that given in [2] which offered greater tuning flexibility. With this technique the effect of finite channel conductance, $g_{ds}$, was examined and a design was proposed which minimized sensitivity to $g_{ds}$. Using a FET operating in its linear region as a variable resistor, the frequency at which maximum Q occurred could be controlled. For narrow bandwidths the Q factor approached 500, however, the loss resistance showed a strong frequency dependence.

A resonator design described by Haigh [4] introduced tuning of both the resonant frequency and the Q factor. A resonant circuit was formed by using two integrators terminated in a capacitance and connected in a feedback loop. Although the resonant frequency remained independent of Q tuning, the circuit showed a large loss resistance for frequencies below the resonant frequency.

Tuning control of both inductance and Q factor was also reported in a topology proposed by Lucyszyn and Robertson [5]. This design simulated an inductance that was adjustable over a narrow range of values by changing the gate bias voltage of a single FET. The Q factor could also be tuned to be maximum at an arbitrary frequency. However, as with the previous design, the loss resistance showed an appreciable frequency dependence resulting in very narrow band performance.

A more recent design presented by Yong-Ho et al [6] expanded on a common Q enhancement technique using a single FET with lossy inductive feedback. Instead of using a passive feedback inductor, an active inductor circuit was used in this design. The inductance was made tunable over a wide range by varying the loss resistance of the active feedback circuit. Tuning of the Q factor was accomplished by varying the positive supply voltage for all FETs and could only be set to infinity for a narrow band of frequencies. The loss resistance also varied over a wide range for frequencies outside of this narrow band.

List of References
1. T. Tokumitsu, T. Tanaka, M. Aikawa, S. Hara, *Broadband Monolithic Microwave Active Inductor And its Application to Miniaturized Wide-band Amplifiers*, in IEEE Trans. Microwave Theory Tech., vol 36, pp. 1920–1924, December 1988.
2. T. Tokurnitsu, M. Aikawa, S. Hara, *Lossless, Broadband Monolithic Microwave Active Inductors*, in IEEE MTT-S Symp. Dig., 1989, pp. 955–958
3. P. Alinikula, R. Kaunisto, K. Stadius, *Q-Enhancing Technique for High Speed Active Inductors*, in 1994 IEEE International Symposium on Circuits and Systems, pp. 735–738.
4. D. G. Haigh, *GaAs MESFET Active Resonant Circuit for Microwave Filter Applications*, in IEEE Trans. Microwave Theory Tech., vol 42, pp. 1419–1422, July 1994.
5. S. Lucyszyn, I. D. Robertson, *Monolithic Narrow-Band Filter Using Ultrahigh-Q Tunable Active Inductors*, in IEEE Trans. Microwave Theory Tech., vol 42, No. 12, pp. 2617–2622, December 1994.
6. C. Yong-Ho, H. Song-Cheol, K. Young-Se, *A Novel Active Inductor and Its Application to Inductance-Controlled Oscillator*, in EEE Trans. Microwave Theory Tech., vol 45, No.8, pp.1208–1213, August 1997.

SUMMARY OF THE INVENTION

In this patent document, a novel design for an active inductor is presented with more flexible tuning control than the prior art just described. It is an object of the invention to provide a series loss resistance of the simulated inductance that is frequency independent over a wide bandwidth. This constant resistance can be varied over a broad range of both positive and negative values with negligible impact on the effective inductance of the circuit. The inductance realized by the circuit is also tunable and remains independent of series loss tuning.

Thus, an active inductor is provided preferably implemented as a fully integrated GaAs MESFET active inductor. Both the inductance and loss resistance are tunable with the inductance independent of series loss tuning. DC tuning of the loss resistance can also be achieved with complete independence of the loss resistance and inductance.

Bandwidth of the active inductor may be selected according to the fabrication technology employed and the intended application of the circuit.

According to an aspect of the invention, there is thus provided an active inductor formed as a monolithic integrated circuit. The active inductor has an input impedance that simulates an inductance with a loss resistance. The active inductor comprises a first capacitor and a second capacitor connected at a common voltage point $V_2$, and each of the first capacitor and second capacitor being ungrounded. Circuit elements are arranged about the capacitors to provide voltage differentials across the capacitors, the voltage differentials being selected so that the loss resistance of the active inductor is tunable independently of the inductance of the active inductor. The circuit elements are preferably controlled sources, and the controlled sources are preferably implemented as MESFETs.

According to a further aspect of the invention, a negative impedance circuit is provided in parallel with the input of the active inductor. This increases the bandwidth of the active inductor.

These and other aspects of the invention are described in the detailed description of the invention and claimed in the claims that follow.

BRIEF DESCRIPTION OF THE DRAWINGS

There will now be described preferred embodiments of the invention, with reference to the drawings, by way of illustration only and not with the intention of limiting the scope of the invention, in which like numerals denote like elements and in which.

DETAILED DESCRIPTION OF PREFERRED EMBODIMENTS

In this patent document, "comprising" means "including", and does not exclude other elements being present. In addition, a reference to an element by the indefinite article "a" does not exclude the possibility that more than one of that element is present. A capacitor is any device that provides capacitance in a circuit.

Figure 1:
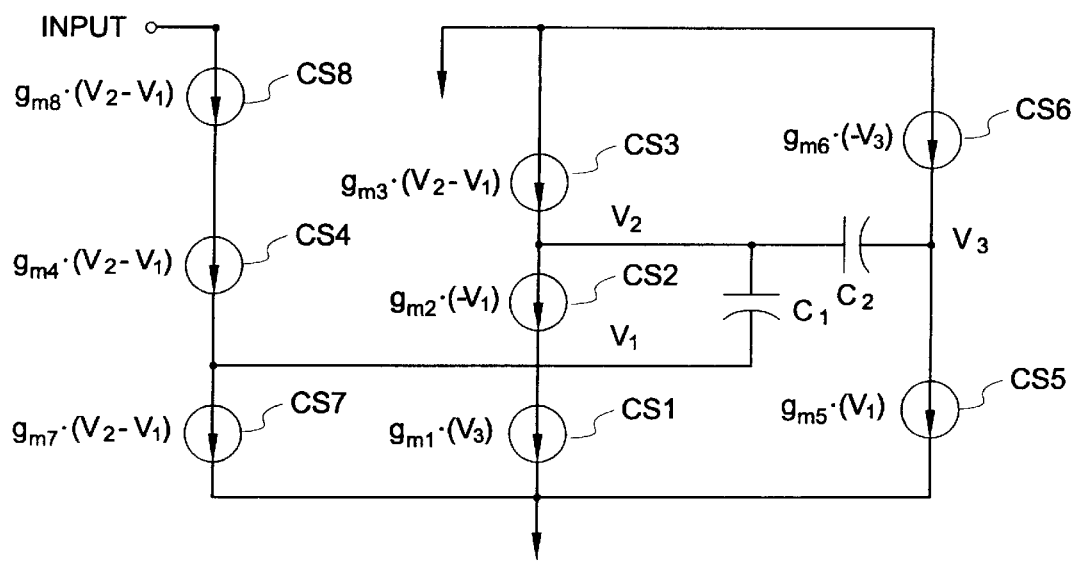
FIG. 1 shows a controlled source schematic of a first embodiment of an active inductor according to the invention.
Figure 2:
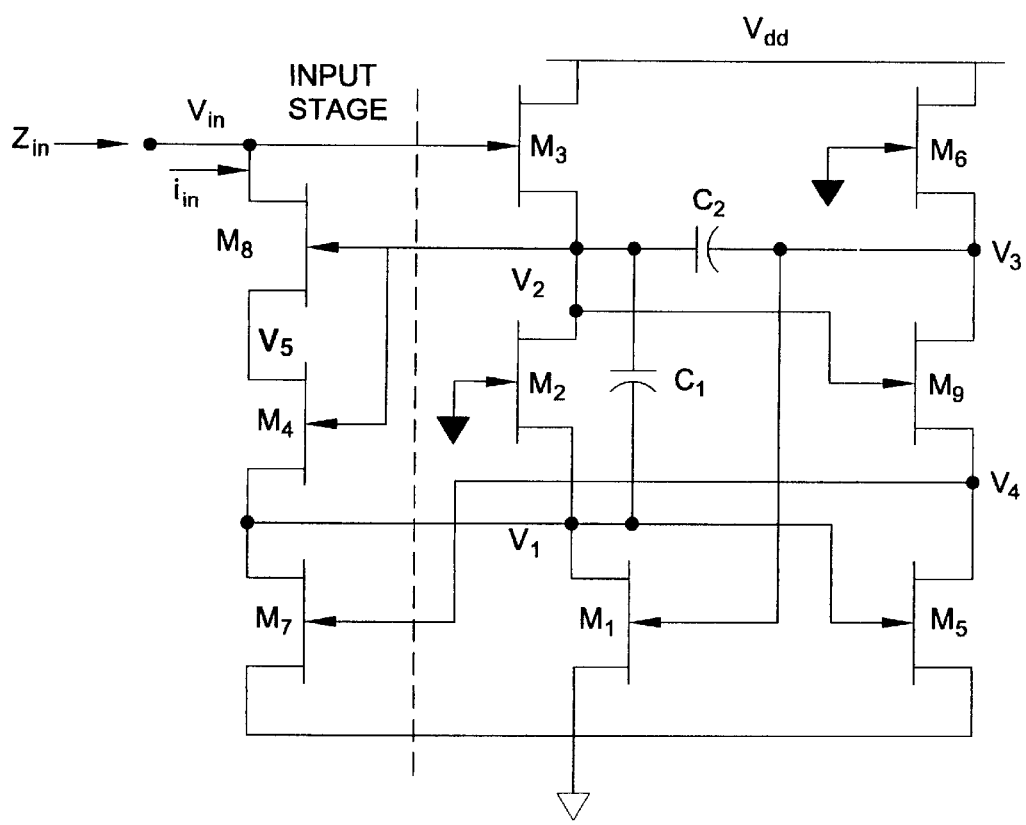
FIG. 2 is a circuit showing a realization of the first embodiment using MESFETs.

FIG. 1 shows a controlled source format of an embodiment of a circuit for carrying out the invention. The controlled sources CS1–CS8 can be realize with a variety of transistors or other circuits, ie. MOS, bipolar, etc. The active inductor shown in FIG. 1 is preferably formed as a monolithic integrated circuit. The controlled sources are preferably MESFETs as shown in FIG. 2. The active inductor shown in FIGS. 1 and 2 has an input impedance that simulates an inductance with a loss resistance. As shown in FIGS. 1 and 2, a capacitor $C_1$ and a capacitor $C_2$ are connected at a common voltage point $V_2$. Capacitor $C_1$ is separated from ground by a controlled source CS1, and capacitor $C_2$ is separated from ground by a controlled source CS5. Circuit elements formed of controlled sources CS1–CS8 (equivalent to MESFETs M1–M8 in FIG. 2) are arranged about the capacitors $C_1$ and $C_2$ to provide voltage differentials across the capacitors $C_1$ and $C_2$ such that the loss resistance is tunable independently of the inductance of the active inductor. The circuit elements include a first controlled source CS1 (implemented with MESFET MI in FIG. 2) connected between capacitor $C_1$ and ground, and a second controlled source CS2 (implemented with MESFET M2 in FIG. 2) connected across the capacitor $C_1$ between the first controlled source CS1 (drain of M7) and the common voltage point $V_2$. Controlled sources CS1–CS3 implemented as MESFETs M1, M2 and M3 are connected in a common source cascode arrangement. The drain of MESFET M3 is connected to Vdd, and the common voltage point $V_2$ is connected between controlled source CS3 (source of M3) and controlled source CS2 (drain of M2). Plural controlled sources CS5 and CS6 (implemented with M5, M6 and M9 in FIG. 2) are arranged as an inverting feedback loop such that the voltage $V_1$ between the capacitor $C_1$ and the first controlled source CS1 has the same poles as $V_2$. An input stage including controlled sources CS8, CS4 and CS7 is arranged to set the input impedance proportional to the difference between $V_1$ and $V_2$. Currents are arranged to flow through the controlled sources according to the values placed next to them in FIG. 1, where $g_{mx}$ represents the transconductance of controlled source x. In the case of the MESFETs of FIG. 2, current flow is controlled by controlling the gate voltages.

From FIG. 1, the input impedance $Z_{in}$ can be found from straightforward nodal analysis. Small signal analysis of the circuit gives $V_1$, $V_2$ and $V_3$ as $$V_1 = g_{m3} V_{in} \frac{(C_1 g_{m5} - g_{m2} C_2 + j\omega C_1 C_2)}{(Aj\omega + B)}$$

$$V_2 = g_{m3} V_{in} \frac{(C_1 g_{m5} + g_{m2} C_2 + j\omega C_1 C_2)}{(Aj\omega + B)}$$

$$V_3 = g_{m3} V_{in} \frac{(-C_1 g_{m5} + g_{m2} C_2 + j\omega C_1 C_2)}{(Aj\omega + B)}$$

where $$A = C_1 C_2 (g_{m2} + g_{m3} + 2g_{m5})$$

$$B = C_2 (g_{m2}^2 + g_{m2} g_{m3}) + C_1 (g_{m5} g_{m3} - g_{m5} g_{m2})$$

assuming that $C_1$ and $C_2$ are much larger than the parasitic capacitances of each FET, preferably at least 10 times as large. Both $V_1$ and $V_2$ are first order functions of the input port voltage, $V_{in}$.

The feedback voltage $V_3$ causes $V_1$ and $V_2$ to differ only by a sign inverted term in their numerator terms. By subtracting $V_1$ from $V_2$ only a single constant term remains in the numerator expressions. Setting the small signal input current equal to $g_{m4}(V_2-V_1)$, the simulated inductance of the circuit, $L_{sim}$, is given by $$L_{sim} = C_1 \frac{g_{m2} + g_{m3} + 2g_{m5}}{2g_{m2} g_{m3} g_{m4}}$$

which is independent of $C_2$ and tunable via $C_1$, with a series loss resistance given by $$R_{loss} = \frac{g_{m2}^2 + g_{m2} g_{m3}}{2 g_{m2} g_{m3} g_{m4}} + \frac{KC_1}{C_2} g_{m5} \left( \frac{g_{m3} - g_{m2}}{2 g_{m2} g_{m3} g_{m4}} \right)$$

which is frequency independent and tunable via $C_2$.

K is a curve fitting constant where 0.3<K<0.4. For an appropriate choice of FET dimensions, $R_{loss}$ can be made tunable over a wide range of both positive and negative resistances. Since the simulated inductance is independent of $C_2$, the simulated inductance is independent of series loss resistance tuning.

Similar characteristics can be obtained by using ($V_3-V_2$), etc. Various realizations of the circuit are possible. One example of a realization is shown in FIG. 2. Both the simulated inductance, $L_{sim}$, and the series loss resistance, $R_{loss}$ are made tunable with two variable capacitors $C_1$ and $C_2$. If $R_{loss}$ is to be tunable independently of the inductance, the input impedance expression must be of the form $$Z_{in}=j\omega L(C_1)+R_{loss}(C_1,C_2)$$

which consists of an inductance, and a frequency independent series resistance that are some function of the tuning capacitors $C_1$ and $C_2$. $R_{loss}$ is determined by the capacitive ratio $C_1/C_2$ and the inductance is set by the absolute value of capacitance $C_1$ or $C_2$. The input impedance will depend only on $C_1$ and $C_2$ provided they are much larger than the FET parasitic capacitances, preferably at least 10 times as large. This allows the two capacitors $C_1$ and $C_2$ shown in FIG. 1 to be used for separate tuning of $L_{sim}$ and $R_{loss}$ respectively.

In FIG. 2, MESFETs $M_1$, $M_2$, and $M_3$ are connected in a common source cascode topology, with the gate of $M_3$ connected to $V_{in}$ and the gate of $M_2$ grounded. MESFETS $M_5$, $M_6$ and $M_9$ are also connected in a common source cascode topology, and likewise MESFETs $M_7$, $M_4$ and $M_8$, which form the input stage. $M_8$ has its gate grounded, while the gate of $M_9$ is connected to the common voltage point between the capacitors $C_1$ and $C_2$. The gate of $M_5$ is connected between $M_1$ and $M_2$. The common voltage point $V_2$ is also connected to the gates of $M_4$ and $M_8$. The gate of $M_7$ is connected to $V_4$ between the source of $M_5$ and the drain of $M_9$. The sources of $M_1$, $M_5$ and $M_7$ are all grounded.

With MESFETs $M_1$, $M_2$ and $M_3$ in a common source cascode topology as shown in FIG. 2, two voltages $V_1$ and $V_2$ are generated such that if the current into the input port, $i_{in}$, is set proportional to $V_2-V_1$ both $L_{sim}$ and $R_{loss}$ will depend on $C_1$ and $C_2$.

Independence of the inductance from $R_{loss}$ can only be achieved provided $L_{sim}$ does not depend on both $C_1$ and $C_2$. This is accomplished with the second cascode arrangement consisting of $M_5$, $M_6$ and $M_7$ used to form an inverting feedback loop. The inverting feedback loop sets the gate voltage of $M_1$ to $V_3$, which is a phase shifted version of $V_1$ resulting in $V_1$ and $V_2$ to have the same poles.

The input stage formed by $M_7$, $M_4$ and $M_8$ forms a voltage to current conversion that sets the input impedance $Z_{in}$ proportional to $V_2-V_1$. $M_4$ sets the small signal input current equal to $g_{m4}(V_2-V_1)$ resulting in an input impedance with resistive and inductive terms only and with the required form given in the equation for input impedance. FET $M_9$ has no effect on the feedback voltage $V_3$ and is only required to set the gate voltage of $M_7$ to $V_4=g_{m4}(V_2-V_1)$, provided $M_7$ and $M_4$ are matched. If $M_7$ and $M_4$ are matched, then the voltage to current conversion given by $M_7$, $M_4$ and $M_8$ has no impact on node voltages $V_1$ or $V_2$ since $M_4$ injects a current into node $V_1$ equal to that pulled from the node by $M_7$.

FETs $M_7$ and $M_8$ are included to reduce the sensitivity of $Z_{in}$ to the high channel conductance of the input stage FETs. Alternative stacked FET arrangements can be used to minimize the effects of $g_{ds4}$ and $g_{ds8}$. However, the proposed topology reduces the number of FETs required as well as minimizes the effects of $M_4$'s capacitive parasitics.

In an actual realization of the embodiment of the invention shown in FIG. 2, a 1 $\mu$m GaAs MESFET process was used resulting in a total chip area of 1.2 mm×1.7 mm for the complete circuit. The test chip was wire bonded to a chip carrier and the input impedance measurements were done with an HP8510C Network analyzer interfaced through an Elite Test jig.

In order to test the fabricated design, both the inductance and Q tuning capacitors were built as an array of MIM (metal-insulator-metal) capacitors each 30% of the nominal value required for infinite Q. By connecting these smaller capacitors in parallel, the initial capacitances of $C_1$ and $C_2$ were each made 30% larger than required. When tuning the input impedance each capacitor was reduced by small increments by progressively breaking air bridges supporting the second metal layer between each sub-capacitor, effectively removing it from the parallel connection.

Figure 3:
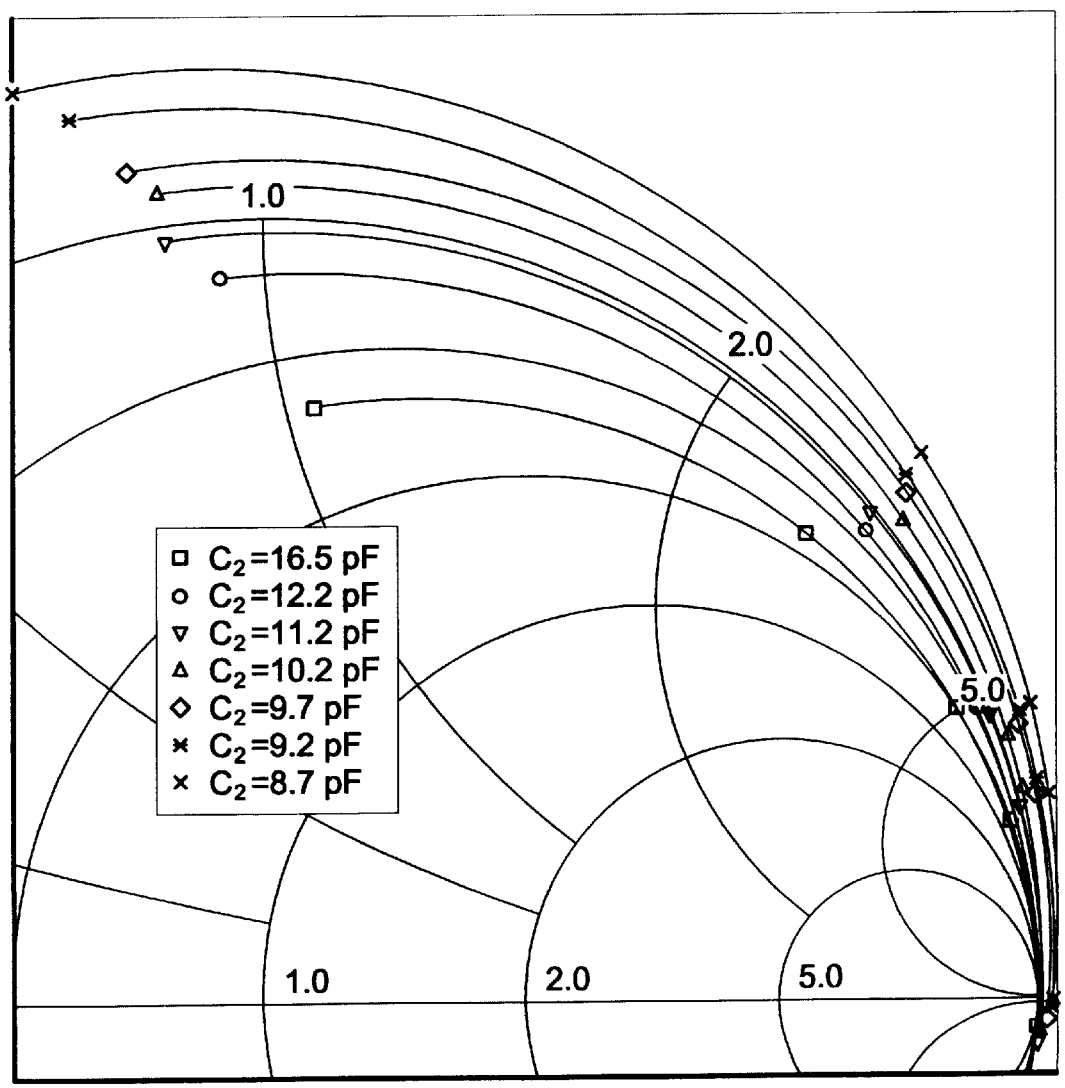
FIG. 3 is a graph showing measured effect of varying the Q tuning capacitor C2 in FIGS. 1 and 2.

With $C_1$ fixed to give a constant inductance, $C_2$ was lowered in small decrements resulting in the set of impedance plots shown in FIG. 3. Initially $C_2$ was larger than required for infinite Q causing the first impedance measured to have a large positive loss resistance (+15 $\Omega$) as predicted by the equation for series loss resistance. Decreasing $C_2$ increased the Q factor, until sufficiently large Q was realized as shown in FIG. 3.

Figure 4:
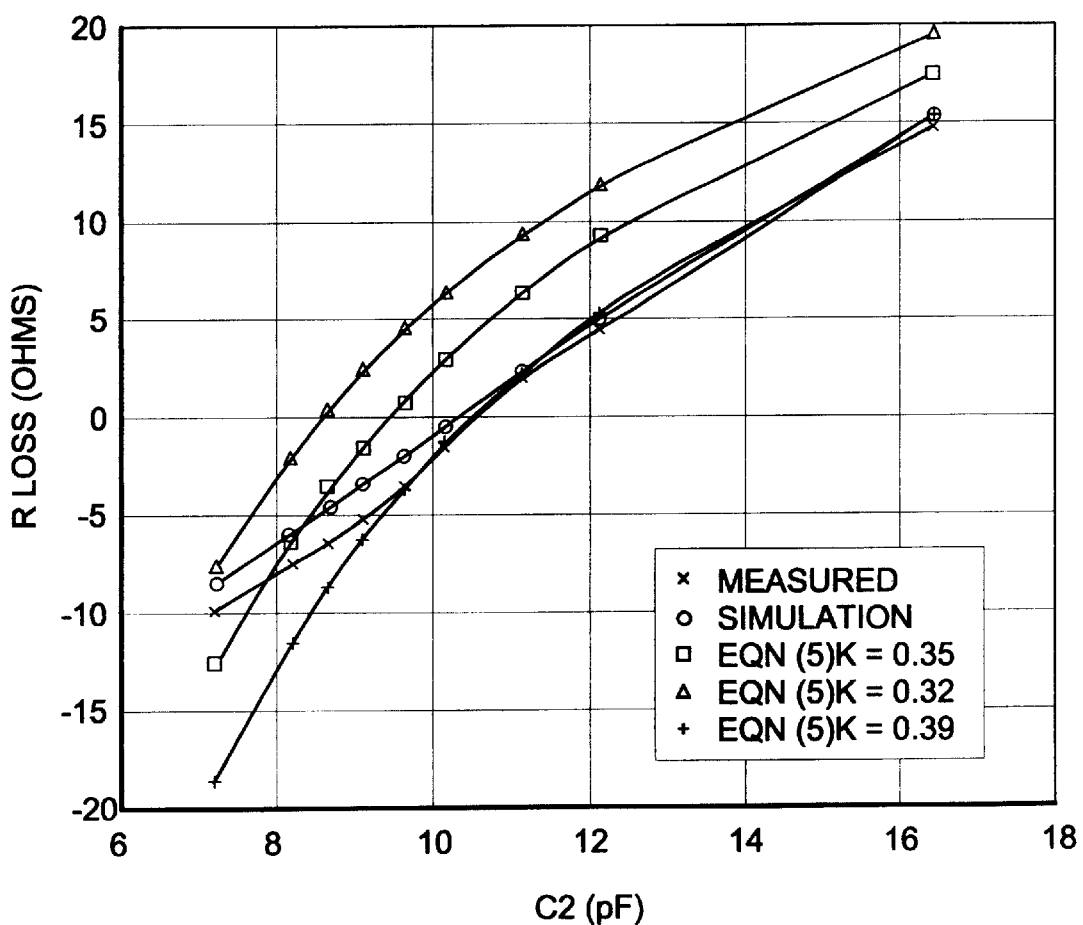
FIG. 4 is a graph showing measured, simulated and theoretical effective loss resistance tuning range as a function of C2 in FIGS. 1 and 2.
Figure 5A:
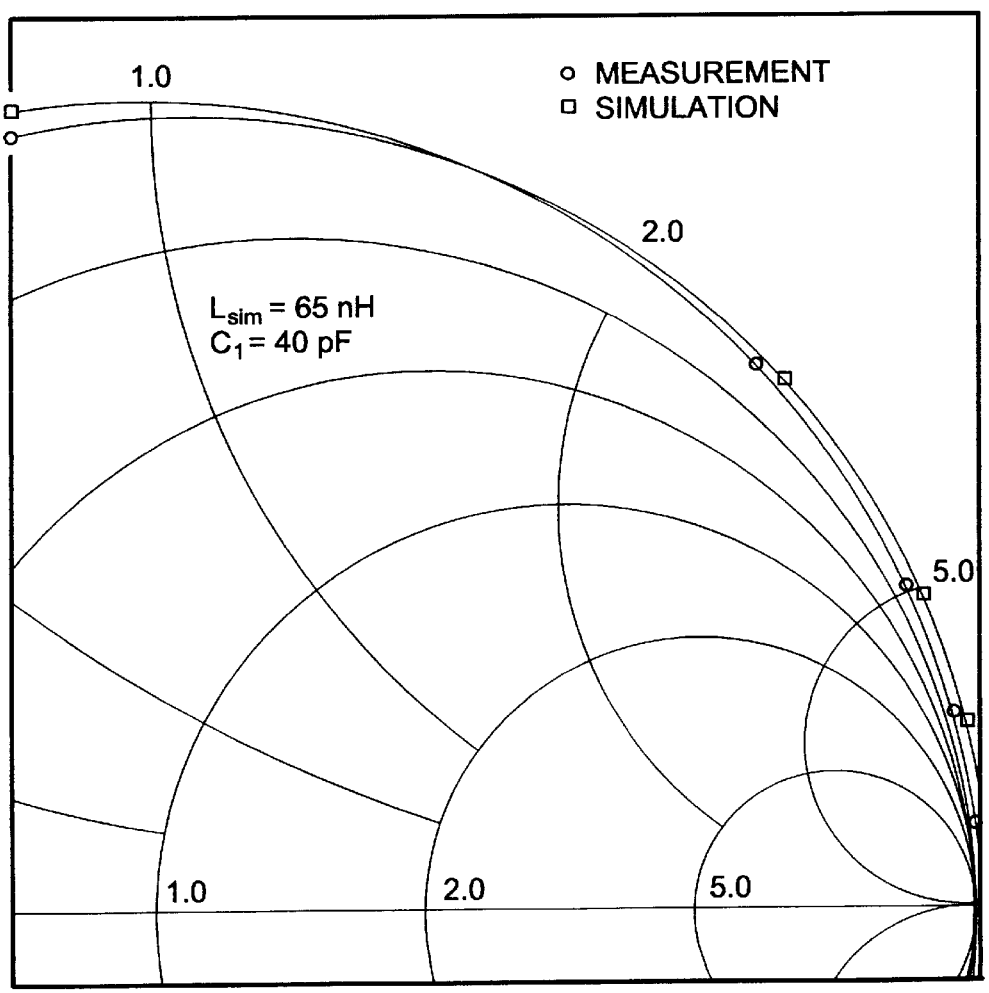
FIG. 5 is a graph showing simulated and measured effect of varying the inductance tuning capacitor $C_1$ in FIGS. 1 and 2.
Figure 5B:
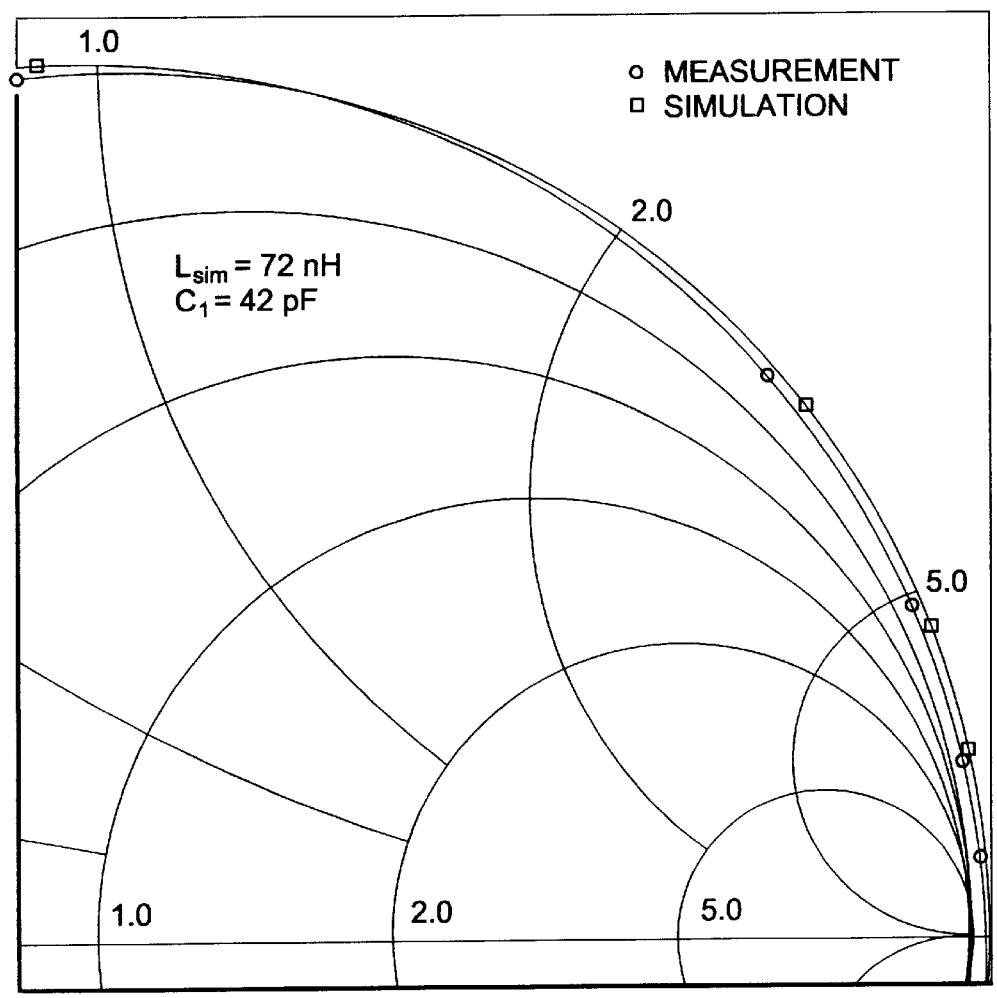
Figure 5C:
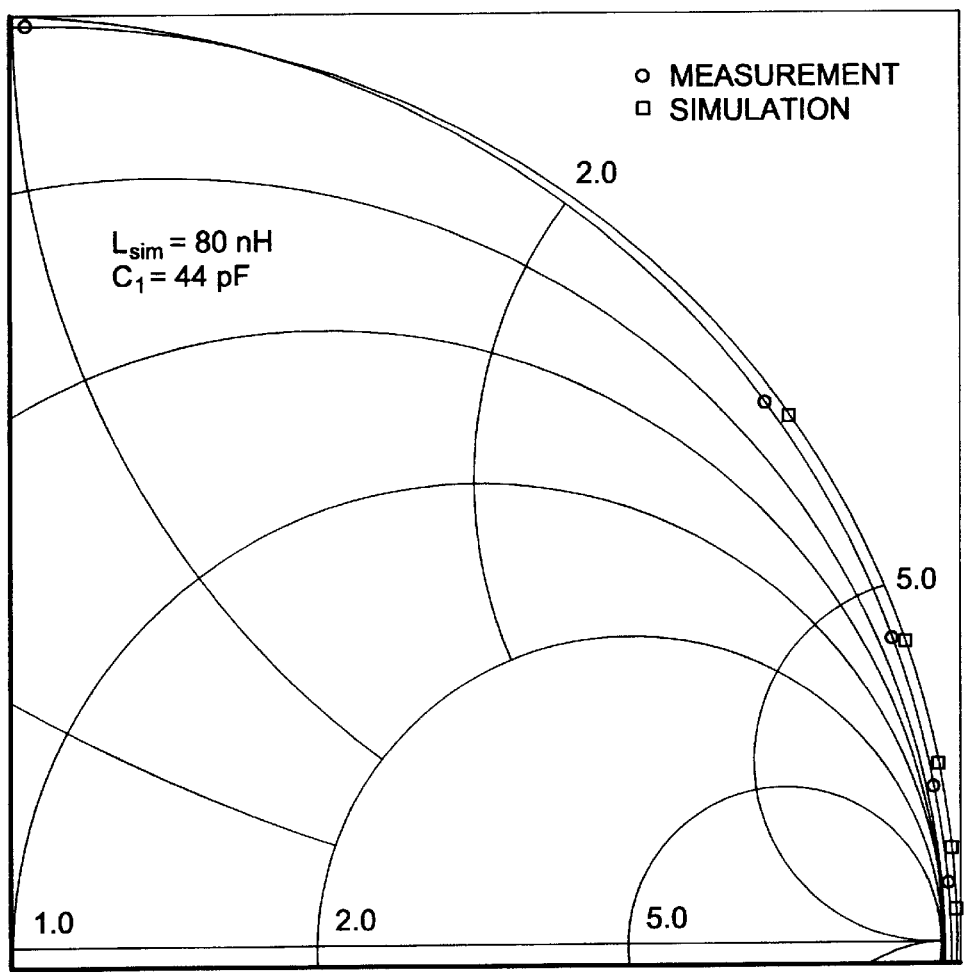
Figure 5D:
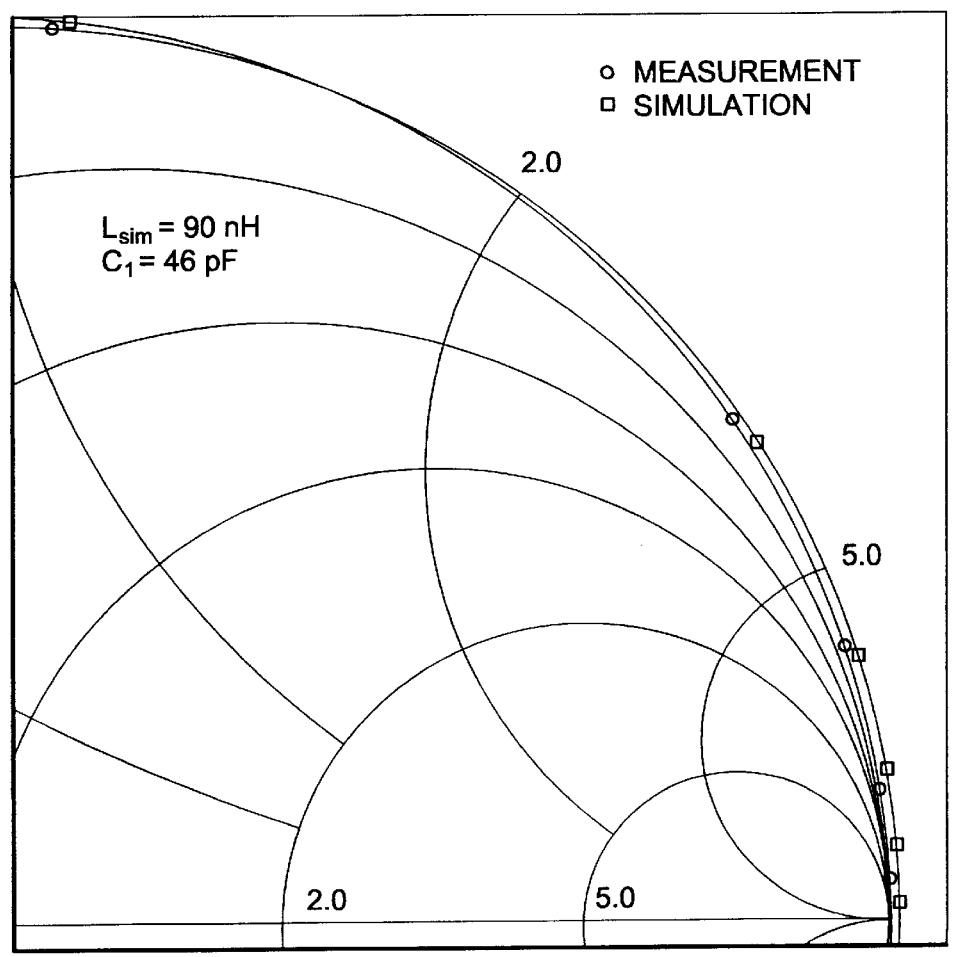

Continuing to lower $C_2$ beyond this point makes the series loss resistance negative in accordance with the equation for series loss resistance. The wide loss resistance tuning range is shown in FIG. 4 in comparison to the expected values from both simulation and the equation for series loss resistance. $R_{loss}$ can be tuned over a 25 $\Omega$ range of both positive and negative resistances corresponding to a 9.3 pF change in $C_2$.

The measured series loss resistance is a nearly linear function of the tuning capacitor $C_2$. This linearity is maintained for negative series resistances when $C_2$ is further decreased below 10 pF. Below 9 pF the assumption that $C_2$ is much larger than the sum of parasitic capacitances is no longer valid and $R_{loss}$ predicted by the equation for series loss resistance begins to diverge from measured and simulation results shown in FIG. 4.

FIG. 5 shows the effects of the parameter K in the equation for series loss resistance. This parameter allows the effects of the large FET channel conductances to be modeled without complicating the expression.

Tuning of the inductance is accomplished by varying $C_1$. As $C_1$ was varied, the ratio $C_1/C_2$ was held constant. This ensures that $R_{loss}$ stays constant in accordance with the equations for simulated inductance and series loss resistance since $R_{loss}$ is determined by the ratio $C_1/C_2$.

Figure 6:
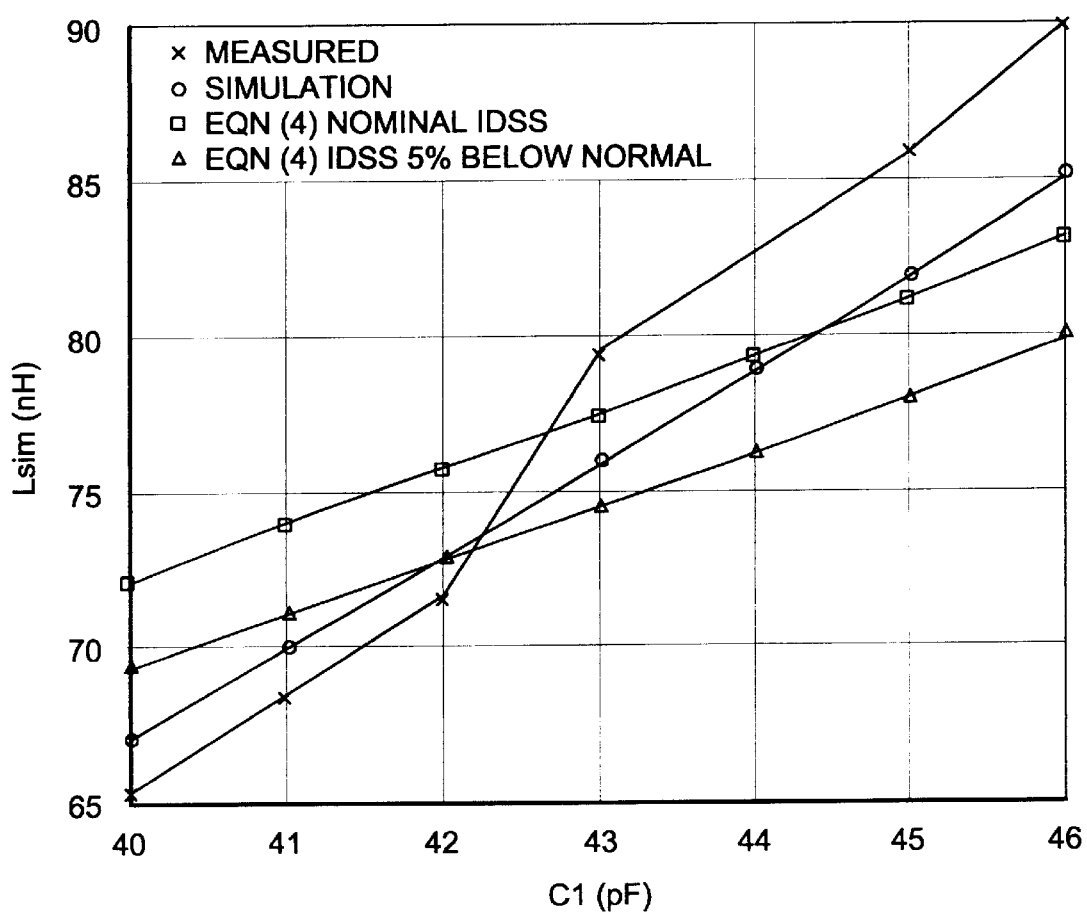
FIG. 6 is a graph showing measured, simulated and theoretical inductance tuning range as a function of $C_1$ in FIGS. 1 and 2.

Different inductance values were measured and plotted to give the set of curves shown in FIG. 5. The good agreement between the simulations and the measurements was obtained by adjusting the DC gate bias slightly to account for a wide variation in the saturated drain current of the FETs between test chips. The effective bandwidth of each inductance was not affected by tuning of either $C_1$ or $C_2$. The measured inductance tuning range is shown in FIG. 6 with expected values from simulation and the equation for simulated inductance. As in the case of loss resistance tuning, the inductance dependence on $C_1$ is also approximately a linear function.

FIG. 6 also shows the expected $L_{sim}$ when the maximum drain current for a given FET geometry, $I_{dss}$, is 5% below the nominal value for the process. As shown, the dynamic tuning range of $L_{sim}$ is not altered by variations in $I_{dss}$. The wider dynamic range measured can be reflected in the simulations by changing the DC bias conditions in the simulations. The smaller tuning range given by the equation for simulated inductance is a result of neglecting the large channel conductance of the FETs. As shown in FIG. 4 and FIG. 6 the equations for simulated inductance and series loss resistance are reasonably accurate given their simplicity and proved useful throughout the design of the circuit. Simulation results show that a method of electronic tuning can be easily introduced without compromising tuning range by replacing both $C_1$ and $C_2$ with varactor diodes. Since neither capacitor is grounded, each varactor diode must be placed in series with a fixed capacitance for DC blocking.

In conclusion, for the embodiment of FIG. 2, measurement results confirm the tuning control of both the inductance and loss resistance and the independence of the inductance from loss resistance tuning. Simple analytical expressions have been presented for both the inductance and the series loss resistance. Analytic predictions and simulations were found to be in good agreement with measured results. Electronic tuning of both the inductance and loss resistance can be achieved with varactor diodes or gate voltage tuning.

Figure 8:
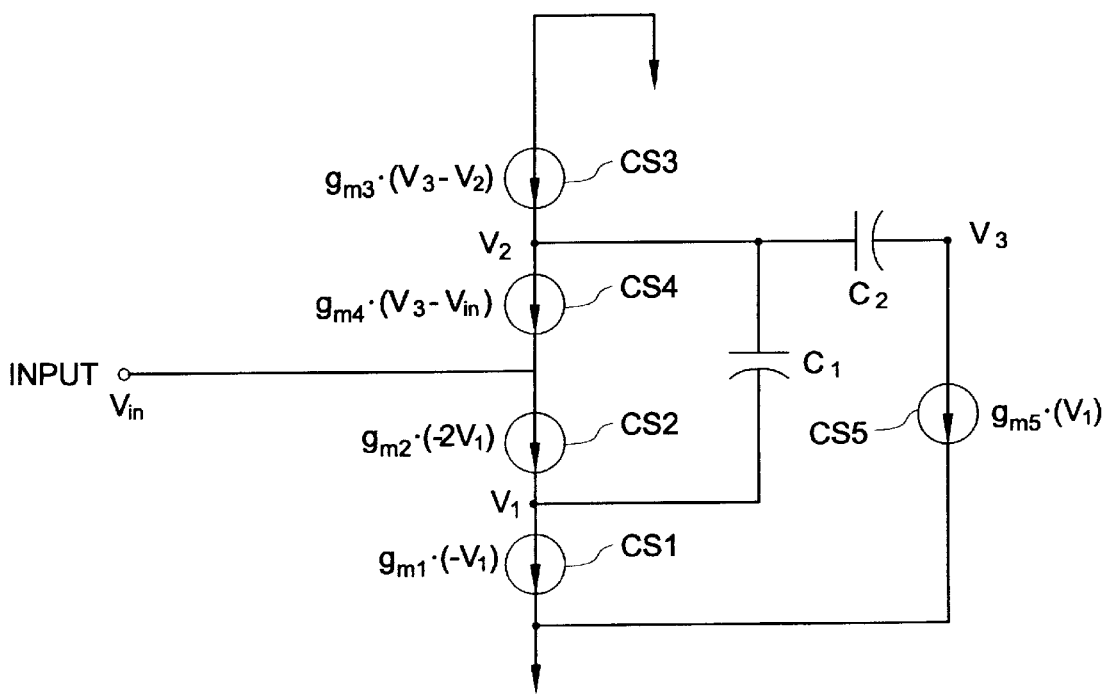
FIG. 8 is a controlled source schematic of a second embodiment of the invention.
Figure 9:
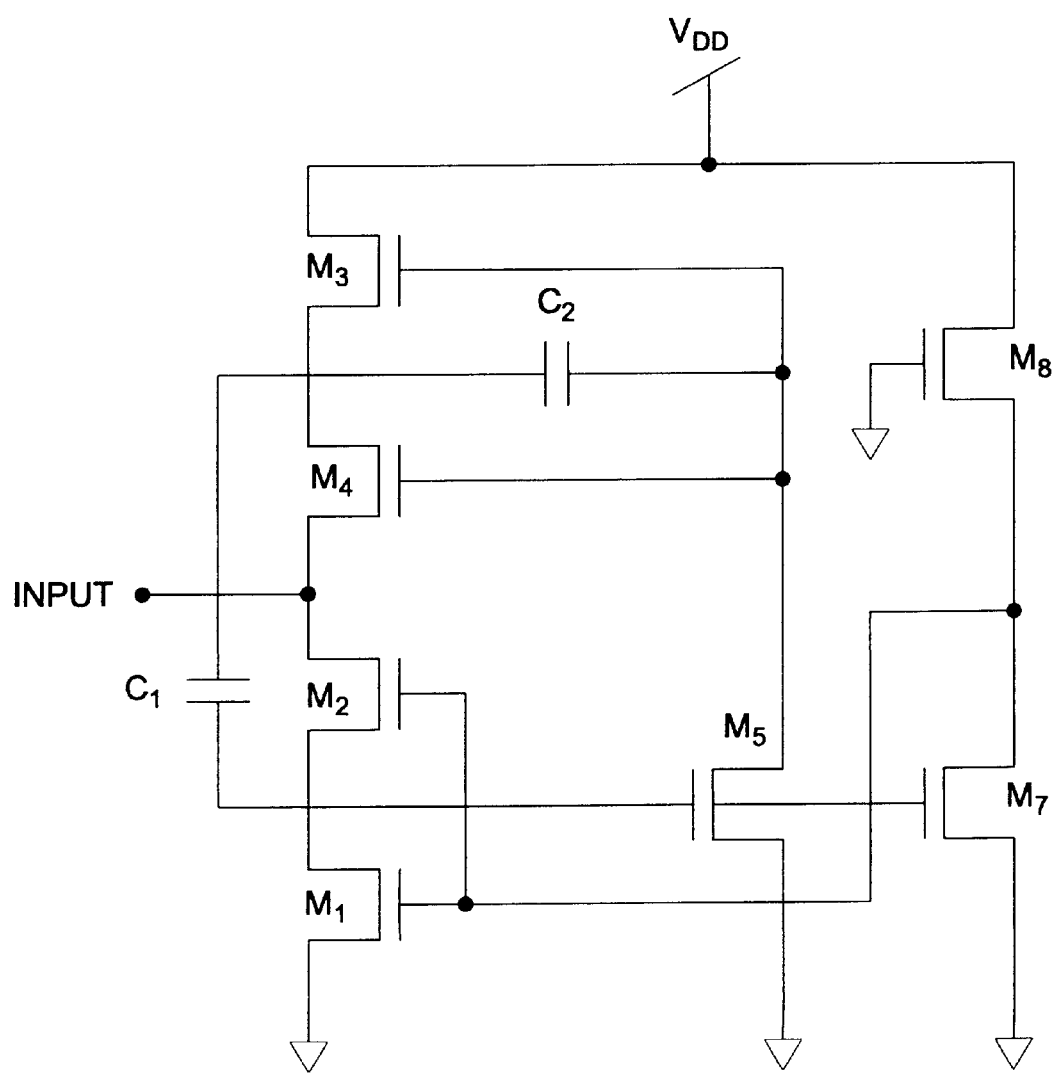
FIG. 9 is an implementation of the embodiment of FIG. 8 using MOSFETs.

A second active inductor according to the invention is shown in FIGS. 8 and 9. FIG. 8 shows a controlled source format, while FIG. 9 shows a realization. Controlled sources CS1, CS2, CS3 and CS4 in FIG. 8 are connected in a common source cascode arrangement, with the source of CS1 and the drain of CS3 both grounded, and with input voltage provided between CS4 and CS2. Capacitors $C_1$ and $C_2$ are connected to a common voltage point $V_2$ between CS3 and CS4. Capacitor $C_1$ is placed across the controlled sources CS2 and CS4, while capacitor $C_2$ is isolated from ground by controlled source CS5, and capacitor $C_1$ by CS1. When the currents are set through the controlled sources as shown in FIG. 9, the input impedance is given by $$Z_{in} = j\omega\left(\frac{C_2(g_{m2} + g_{m4} + g_{m5})}{g_{m3}g_{m4}g_{m5}}\right) + \frac{1}{g_{m4}} + \frac{1}{g_{m3}}\left(\frac{C_2}{C_1} - 1\right)$$

In this case, the inductance is tunable using $C_2$, and the loss resistance is independently tunable using $C_1$.

In the realization given in FIG. 9, MOSFETs M1, M2, M3 and M4 correspond to controlled sources CS1, CS2, CS3 and CS4 respectfully. MOSFET M5 corresponds to controlled source CS5. MOSFETs M7 and M8 are provided to set the gate voltage of MOSFETs M1 and M2 to achieve the controlled sources specified in FIG. 8. The gate of MOSFET M8 is grounded, and the gates of MOSFETs M3 and M4 are tied to the voltage point $V_3$, which is connected to the drain of MOSFET M5.

Figure 10:
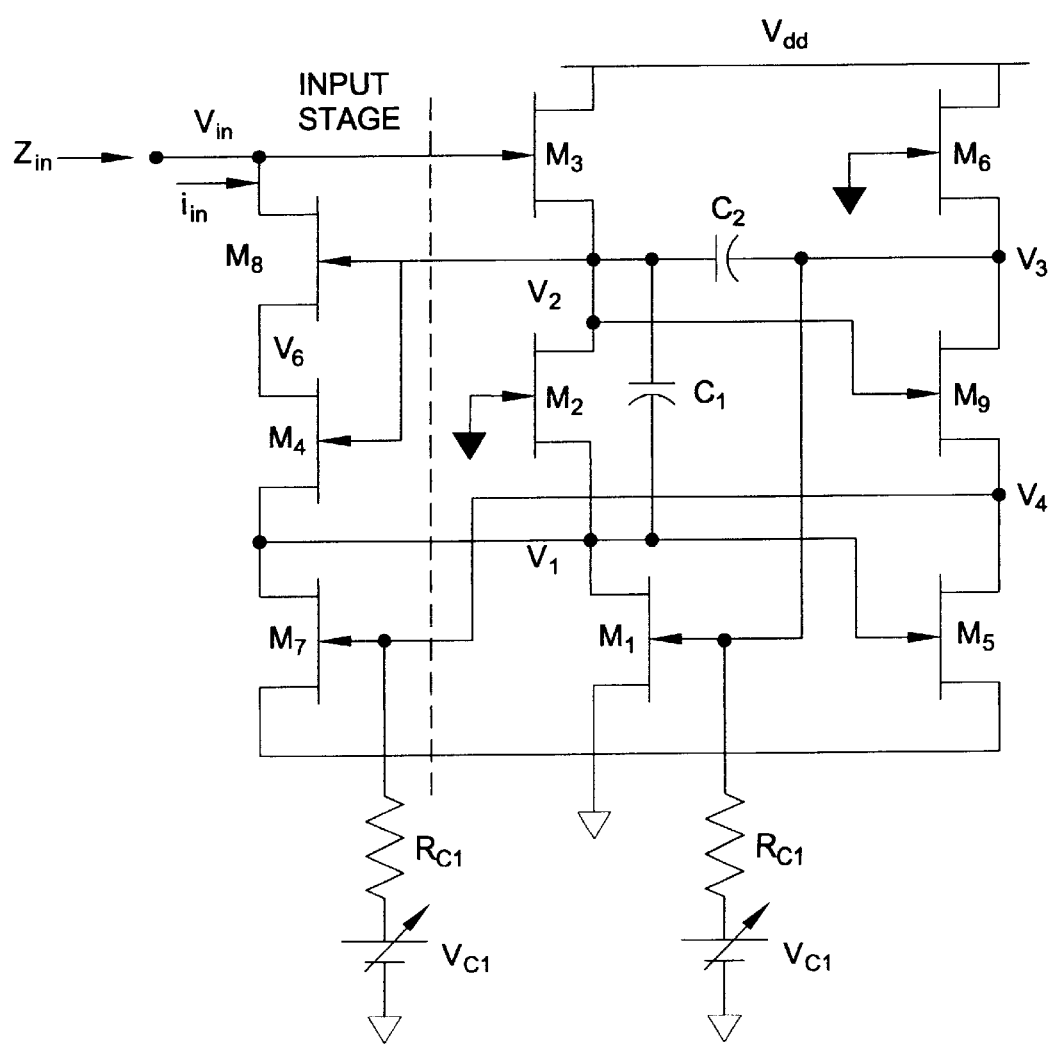
FIG. 10 is a schematic showing a third embodiment of the invention in which gate bias is used to tune inductance and loss resistance.
Figure 11A:
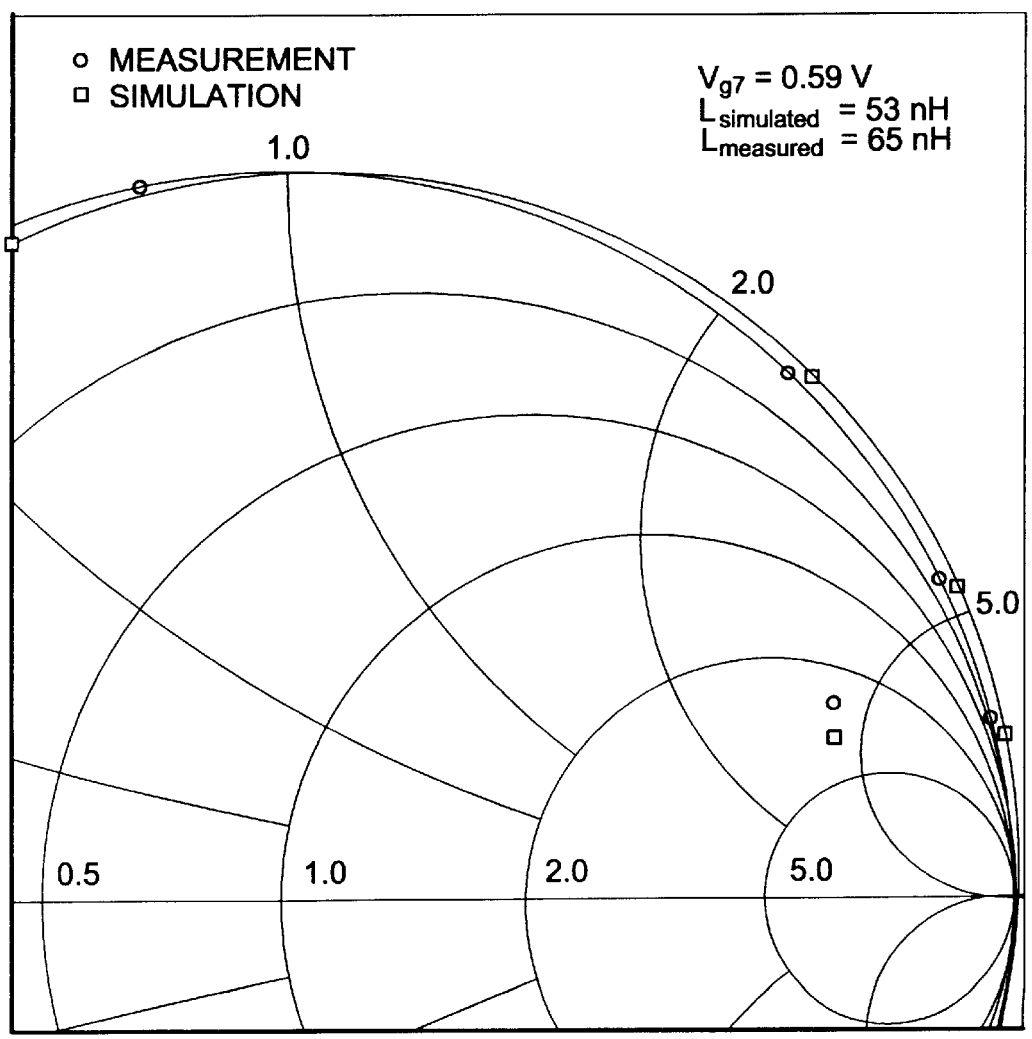
FIG. 11 is a graph showing the measured and simulated effect of varying the inductance tuning voltage $V_{g7}$ in FIGS. 1 and 2.
Figure 11B:
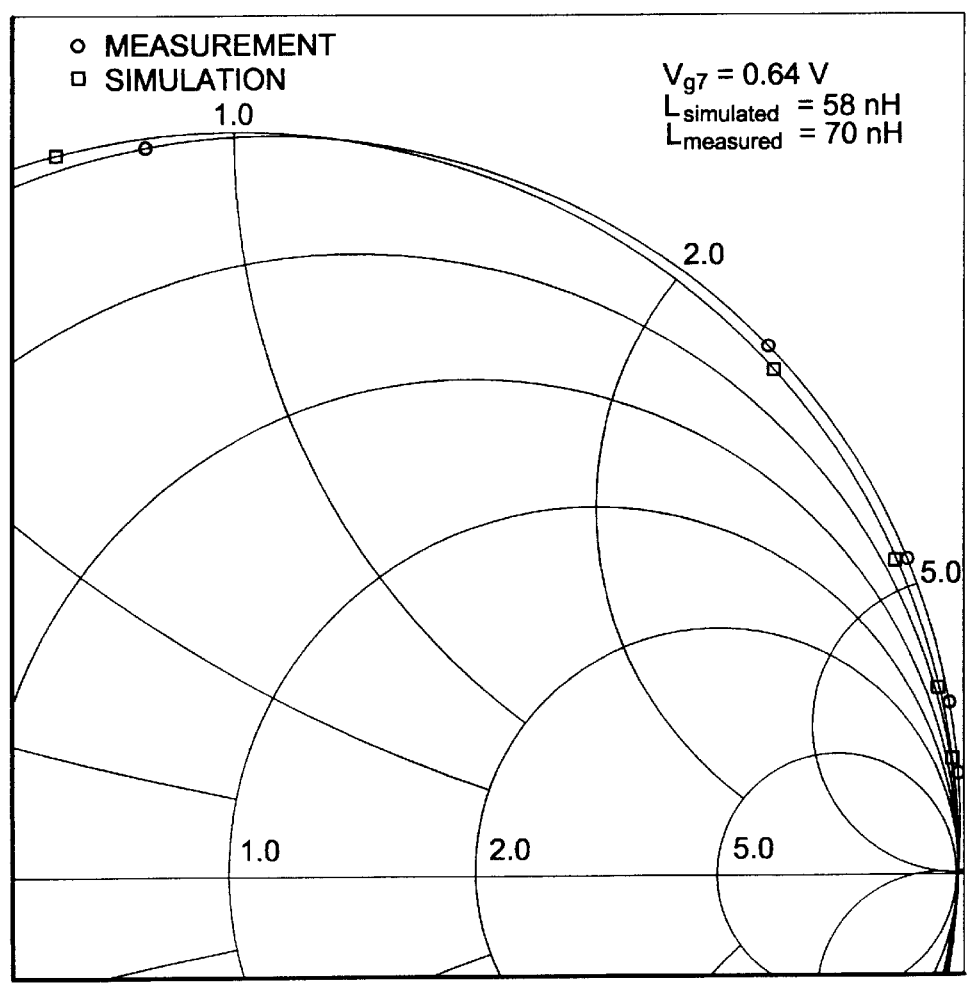
Figure 11C:
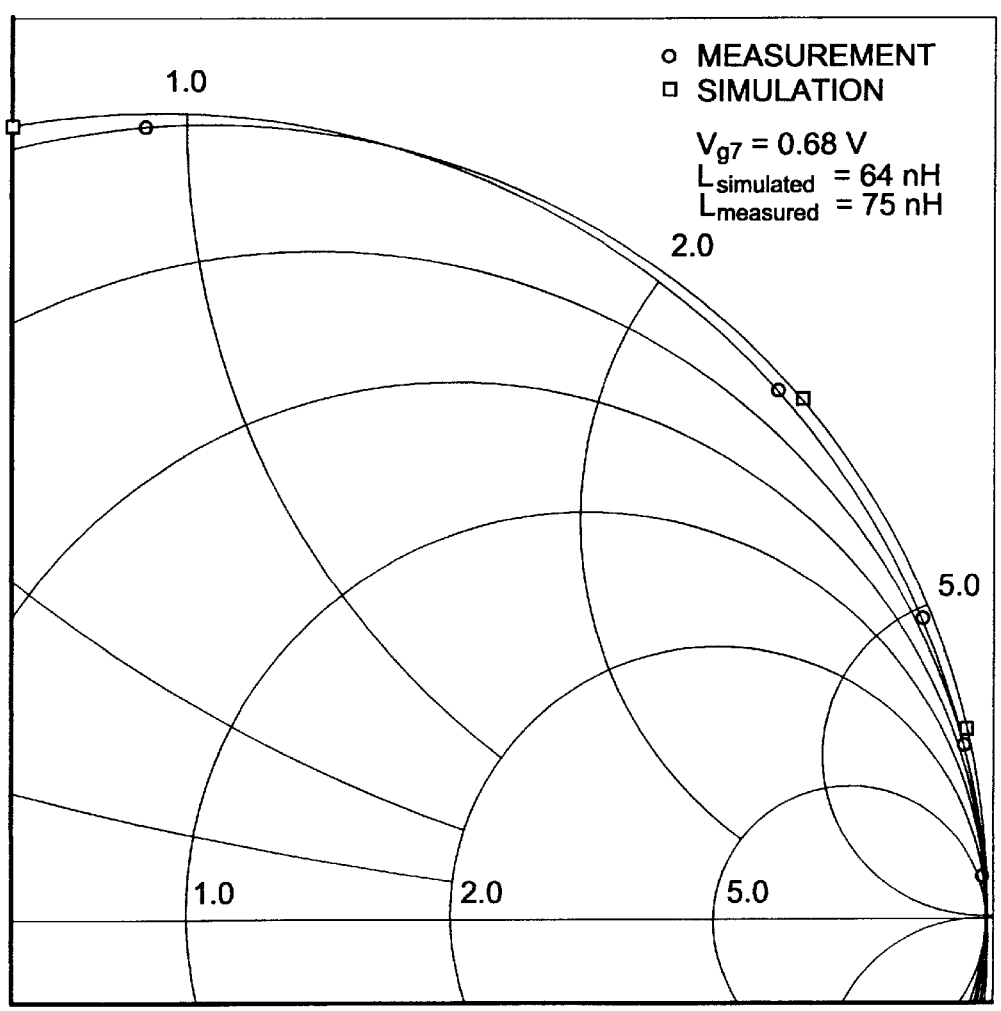
Figure 11D:
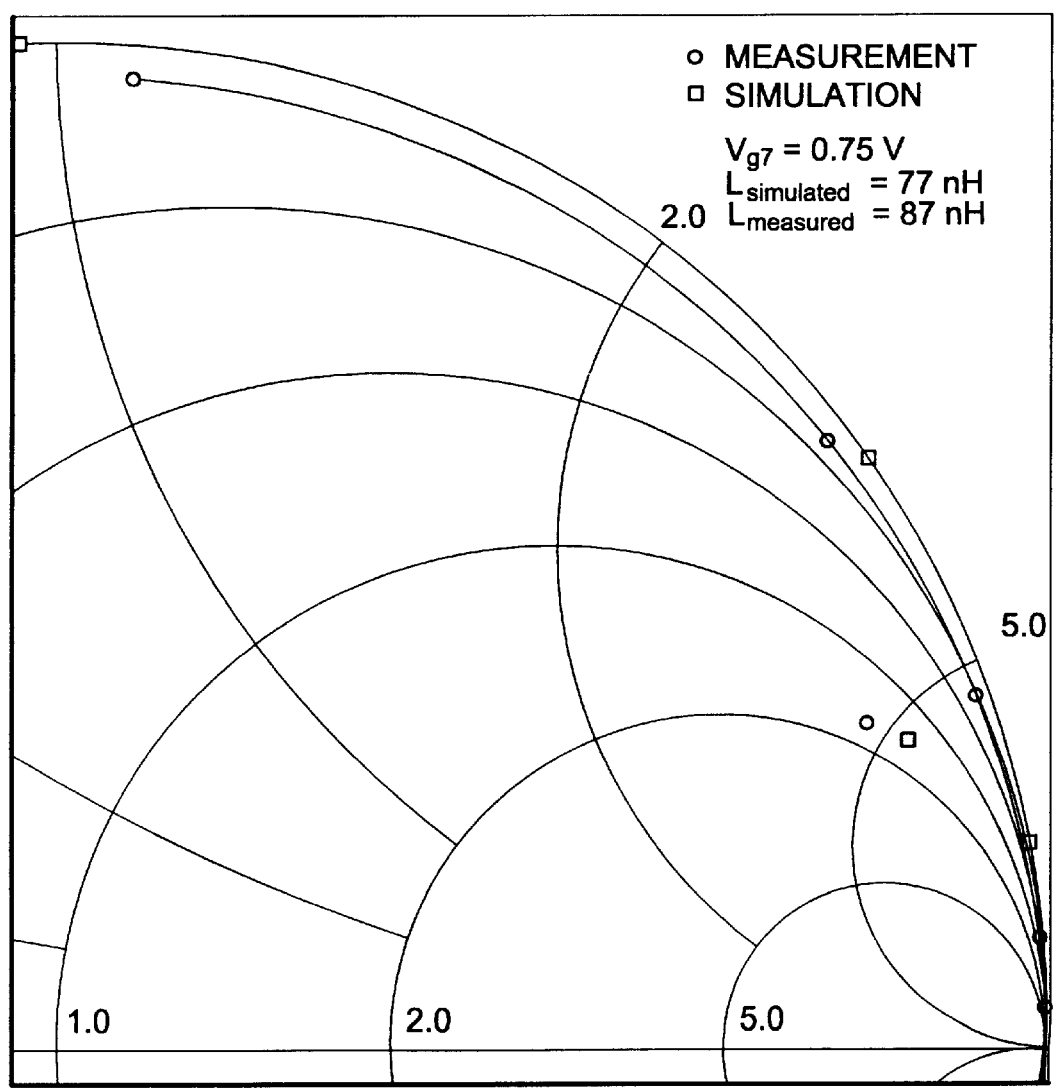
Figure 11E:
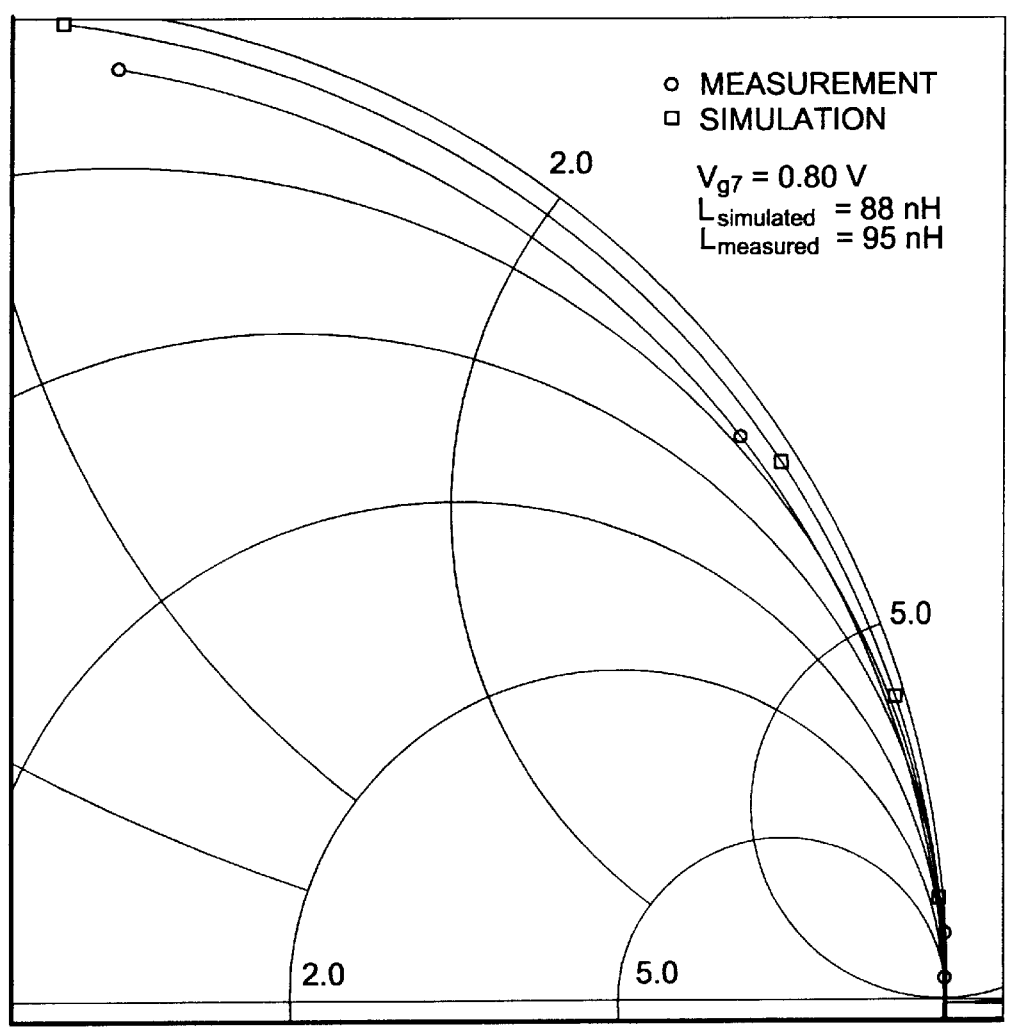
Figure 11F:
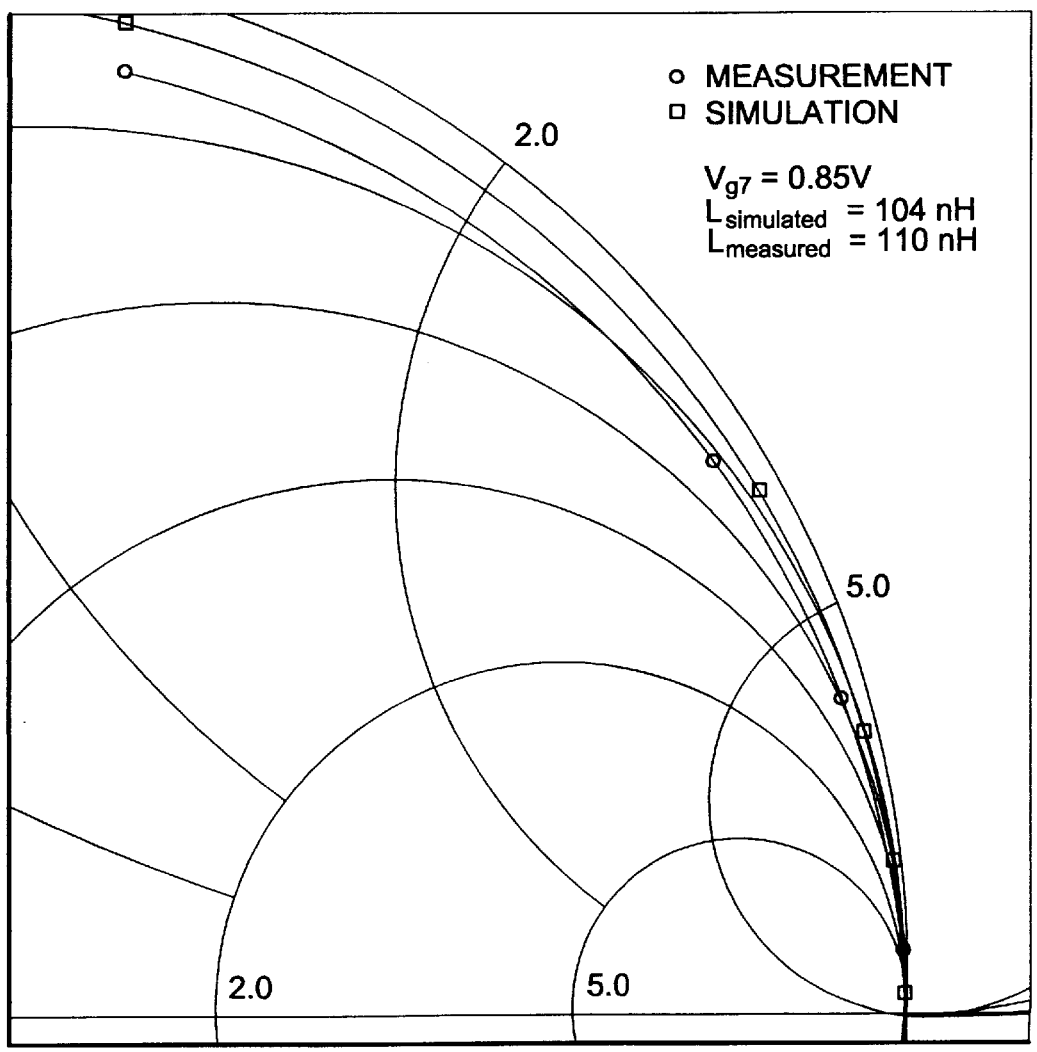
Figure 12:
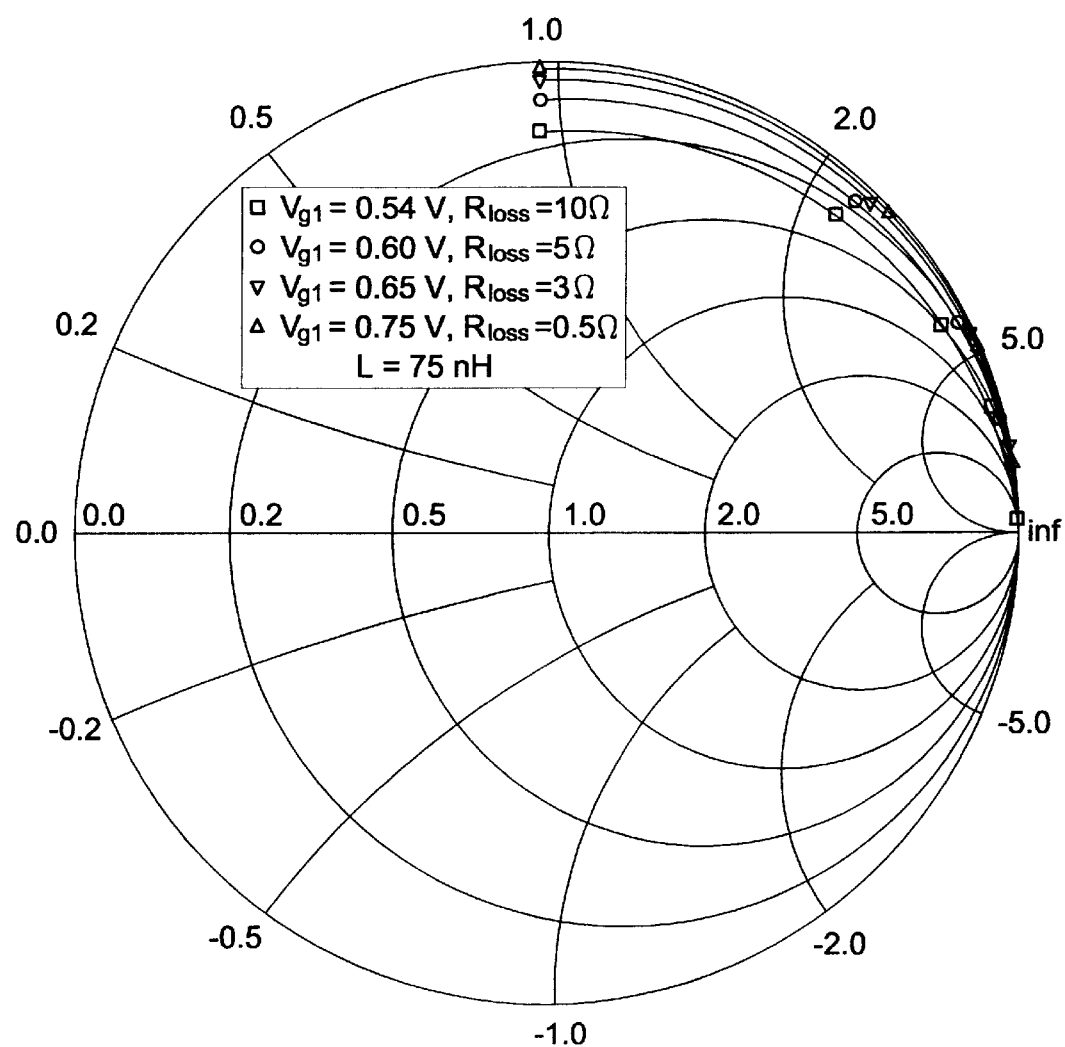
FIG. 12 is a graph showing the measured effect of varying the loss resistance tuning voltage $V_{g1}$ in FIGS. 1 and 2.

FIG. 1 is an ideal representation. If drain-source output conductances are taken into account (ie if voltage-sensitive resistors are placed across each controlled source in the diagram), then it is possible to get a lossy inductor where the inductance and loss resistance can be independently varied by adjusting two bias voltages in the circuit. The range of adjustment is significantly better in this case (a factor of two larger) and the inductance and loss resistance can be tuned completely independently of each other. Adjustment of bias voltages has advantages over use of variable capacitors. The active inductor using adjustment of bias voltages is shown in FIG. 10. Measured results for the MESFET realization in FIG. 10 are shown in FIGS. 11 and 12.

The embodiment of the invention shown in FIG. 10 has the same general form as FIG. 1 and FIG. 2. Capacitors $C_1$ and $C_2$ are connected in the same way to the cascode as the capacitors $C_1$ and $C_2$ in FIGS. 1 and 2. The gate of $M_7$ is provided with an adjustable bias voltage through resistance $R_{G7}$ and variable voltage $V_{G7}$. The gate of $M_1$ is provided with an adjustable bias voltage through resistance $R_{G1}$ and variable voltage $V_{G1}$. Tuning of inductance is achieved by varying the bias voltage $V_{G7}$ on the gate of MESFET $M_7$. Tuning of loss resistance is achieved by varying the bias voltage $V_{G1}$ on the gate of MESFET $M_1$.

Each MESFET has an output conductance that can be varied by varying that transistor's dc gate voltage. For MESFETs, the output conductance can be made quite sensitive to the dc gate voltage by operating at small bias currents. The output conductance can also be made to be quite insensitive to dc gate voltage by operating at large bias currents, which is useful for capacitive tuning.

Analysis, simulation and measurement results have shown that the active inductor equivalent circuit of FIGS. 1 and 2 is an inductor in parallel with a fixed low loss capacitance for frequencies approaching 10 GHz. It is this small capacitance that limits the resonant frequency of the active inductor to 1.1 GHz. Simulations show that the circuit behaves as an ideal inductor when this capacitance is removed or significantly reduced. According to simulation experiments, this range can be increased to 3.3 GHz by placing a negative impedance converter in parallel with the input to the inductor. The negative impedance converter is shown in FIGS. 13 and 14.

Figure 7:
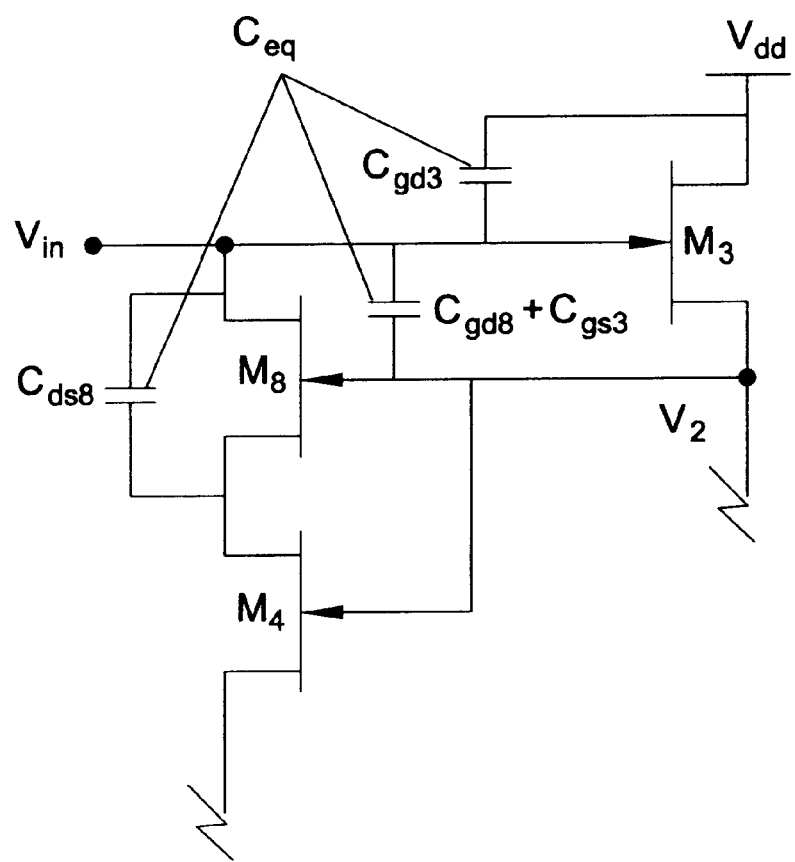
FIG. 7 is a schematic showing bandwidth limiting FET parasitic capacitors in the embodiment of FIGS. 1 and 2.

Analysis and simulation results confirm that it is the capacitive parasitics of FETs $M_3$ and $M_8$ that collectively appear as an equivalent capacitance, $C_{eq}$, to ground as shown in FIG. 7. $C_{ds8}$, $C_{gd3}$ and $C_{gd8}$ shown in FIG. 7 are negligible in comparison to $C_{gs3}$ and thus $C_{gs3}$ dominates the high frequency performance of the circuit. The active inductor's input impedance can be arranged to have very low sensitivities to the remaining FET parasitics including large channel conductance and other FET capacitances. The effect of $C_{eq}$ can be reduced in several ways to considerably extend the effective bandwidth of the inductor. Since a channel length of 1 $\mu$m was used for all FETs in the MESFET embodiment shown in FIG. 2, the gate width required for a reasonable transconductance was also large, resulting in gate-to-source capacitances of the order of 0.6 pF. Simulation results show that a submicron process with a gate length less than 0.5 $\mu$m increases the inductor's effective bandwidth as a result of significantly lower gate-to-source capacitances. Alternatively, a negative impedance converter or NIC at the input port may be used. The tunable negative capacitance with sufficiently low conductive loss provides useful independent tuning of the parallel capacitance or complete removal if desired. If the inductor is used in applications requiring an LC resonator, $C_{eq}$ is desirable and can be left alone without any consequence to circuit performance.

Figure 13:
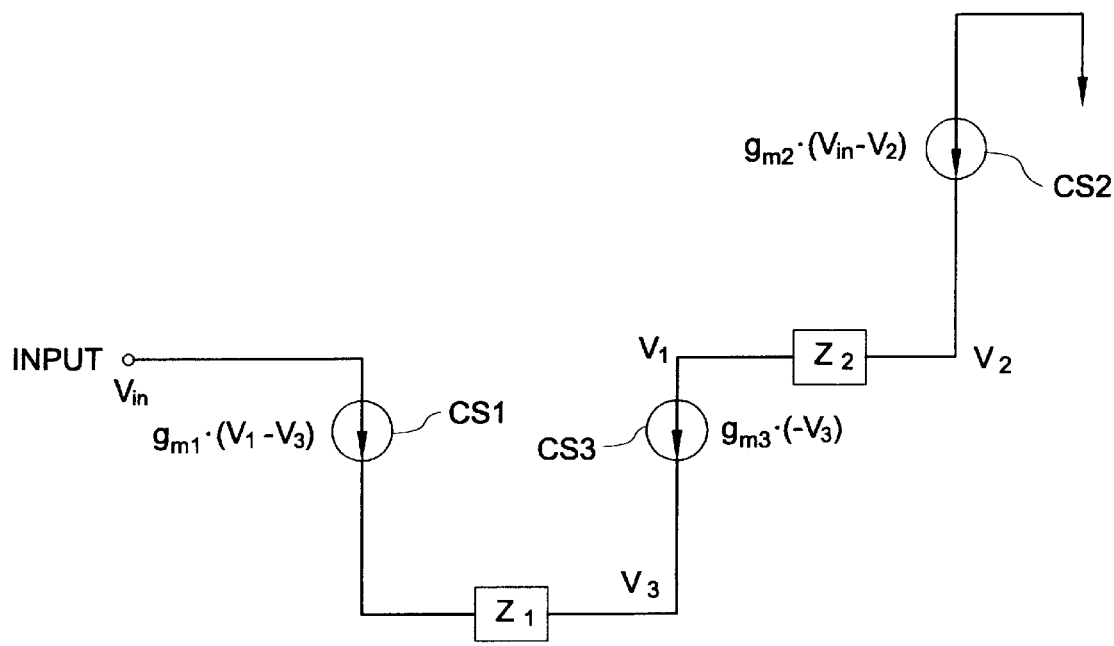
FIG. 13 is a controlled source schematic of a negative impedance circuit for use with the invention.
Figure 14:
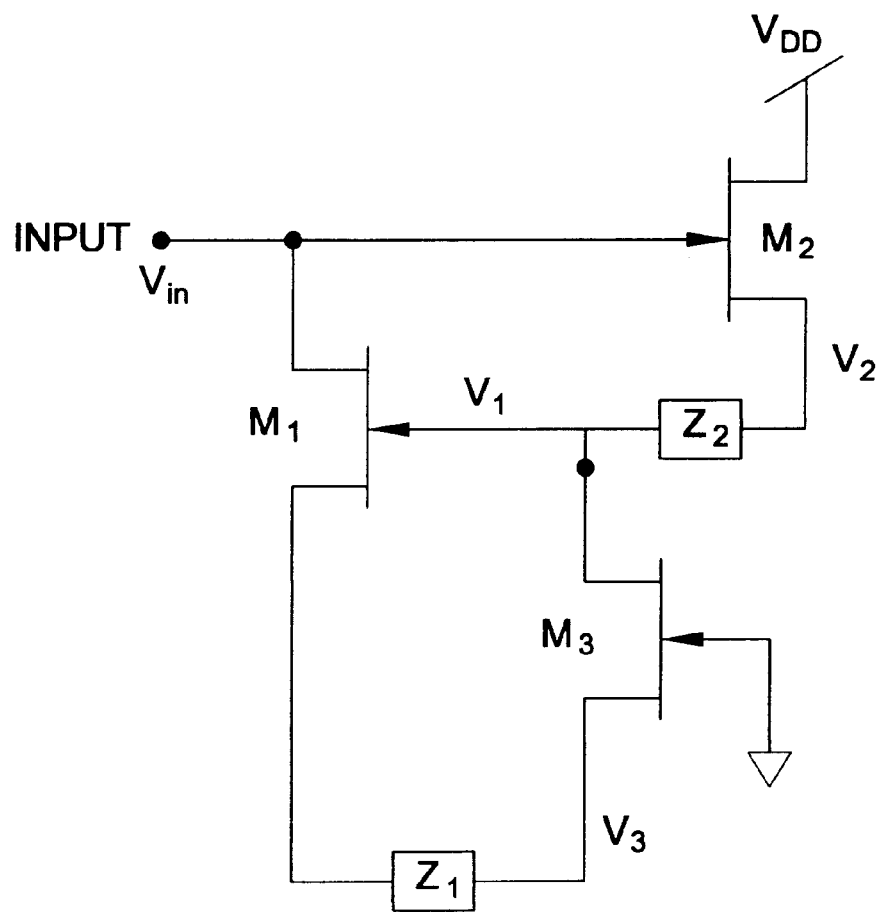
FIG. 14 is a realization of the embodiment of FIG. 13 using MESFETs.

Referring to FIG. 13, an exemplary negative impedance converter is shown, which is provided connected in parallel to the input of the circuit shown in FIG. 1. The negative impedance converter is formed from a series connected controlled source CS1, a complex impedance Z1, a controlled source CS3, a second complex impedance Z2 and a third controlled source CS2. The controlled sources are arranged to have the currents specified in the figure. A realization is shown in FIG. 14. MESFETs M1, M2 and M3 are the controlled sources CS1, CS2 and CS3. The voltage at the gate of M2 is set by $V_{in}$. The voltage at the gate of M1 is set by the voltage between the drain of M3 and impedance Z2. The voltage at the gate of M3 is set to ground. The operation of the negative impedance converter is conventional in itself but the arrangement provides improved bandwidth when used in association with the active tunable inductor described here. The input impedance of the NIC is given by $$Z_{in} = -\frac{1}{g_{m2}} + \frac{1}{g_{m3}} + \frac{1}{g_{m4}} + Z_1 - Z_2$$

The capacitors $C_1$ and $C_2$ in FIG. 1 may be implemented as enhanced FET parasitics, but this implementation is not preferred. In addition, $C_1$ and $C_2$ could be implemented by transistors. It is believed that the bandwidth of the active tunable inductor is limited only by available electronics, and ranges from 1 MHz to over 3 GHz.

Immaterial modifications may be made to the invention described here without departing from the essence of the invention.

What is claimed is:

1. An active inductor formed as a monolithic integrated circuit, the active inductor having an input impedance that simulates an inductance with a loss resistance, and the active inductor comprising:
    a first capacitor and a second capacitor connected at a common voltage point ($V_2$), and each of the first capacitor and second capacitor being ungrounded; and
    circuit elements arranged about the capacitors to provide voltage differentials across the capacitors, the voltage differentials being selected so that the inductance of the active inductor is tunable independently of the loss resistance of the active inductor.

2. The active inductor of claim 1 in which the circuit elements comprise:
    a first controlled source connected between the first capacitor and ground;
    a second controlled source connected across the first capacitor between the first controlled source and the common voltage point;
    plural controlled sources arranged to provide an inverting feedback loop such that the voltage ($V_1$) between the first capacitor and the first controlled source has the same poles as ($V_2$) and
    an input stage including a controlled source that sets the input impedance proportional to the difference between ($V_2$) and ($V_1$).

3. The active inductor of claim 1 or 2 in which the capacitors are variable capacitors, and the inductance is tunable by varying the capacitance of one of the first capacitor and the second capacitor.

4. The active inductor of claim 3 in which the loss resistance is tunable by varying the capacitance of the second capacitor.

5. The active inductor of claim 2 in which the circuit elements are MESFETs, the MESFETs each having a transconductance and a gate bias.

6. The active inductor of claim 5 in which the loss resistance is tunable by varying the gate bias on the first controlled source.

7. The active inductor of claim 6 in which the inductance is tunable by varying the gate bias on the controlled source in the input stage.

8. The active inductor of claim 2 in which the first controlled source, the second controlled source, the plural controlled sources arranged to form an inverting feedback loop and the controlled source in the input state are each MESFETs.

9. The active inductor of claim 1 in which the active inductor is provided with an input stage, and a negative impedance circuit is connected in parallel with the input stage.

10. The active inductor of claim 2 in which a negative impedance circuit is connected in parallel with the input stage.

* * * * *